(12) United States Patent
Chen

(10) Patent No.: US 12,025,877 B2
(45) Date of Patent: Jul. 2, 2024

(54) DISPLAY PANEL AND MANUFACTURING METHOD THEREOF

(71) Applicant: TCL CHINA STAR OPTOELECTRONICS TECHNOLOGY CO., LTD., Guangdong (CN)

(72) Inventor: Xingwu Chen, Guangdong (CN)

(73) Assignee: TCL China Star Optoelectronics Technology Co., Ltd., Guangdong (CN)

(*) Notice: Subject to any disclaimer, the term of this patent is extended or adjusted under 35 U.S.C. 154(b) by 0 days.

(21) Appl. No.: 17/623,565

(22) PCT Filed: Dec. 22, 2021

(86) PCT No.: PCT/CN2021/140501
§ 371 (c)(1),
(2) Date: Jun. 22, 2023

(87) PCT Pub. No.: WO2023/108758
PCT Pub. Date: Jun. 22, 2023

(65) Prior Publication Data
US 2024/0045260 A1    Feb. 8, 2024

(30) Foreign Application Priority Data
Dec. 14, 2021 (CN) .......................... 202111525213.2

(51) Int. Cl.
*G02F 1/1335*   (2006.01)

(52) U.S. Cl.
CPC .. *G02F 1/133514* (2013.01); *G02F 1/133512* (2013.01); *G02F 1/133543* (2021.01); *G02F 1/133614* (2021.01)

(58) Field of Classification Search
CPC ......... G02F 1/133514; G02F 1/133509; G02F 1/133512; G02F 1/133516;
(Continued)

(56) References Cited

U.S. PATENT DOCUMENTS

| 2010/0091218 A1 | 4/2010 | Rho et al. |
| 2012/0320298 A1* | 12/2012 | Suzuki ................ G02F 1/13718 349/193 |

(Continued)

FOREIGN PATENT DOCUMENTS

| CN | 1575434 A | 2/2005 |
| CN | 104199225 A | 12/2014 |

(Continued)

OTHER PUBLICATIONS

International Search Report in International application No. PCT/CN2021/140501, mailed on Apr. 26, 2022.
(Continued)

*Primary Examiner* — Hoan C Nguyen
(74) *Attorney, Agent, or Firm* — PV IP PC; Wei Te Chung; Zhigang Ma

(57) ABSTRACT

The present invention discloses a display panel and a manufacturing method thereof. The display panel includes a plurality of liquid crystal cells, each of the plurality of liquid crystal cells includes cholesteric liquid crystals, and a chiral rotation direction of the cholesteric liquid crystals in one of the plurality of liquid crystal cells is opposite to a chiral rotation direction of the cholesteric liquid crystals in its adjacent ones of the liquid crystal cells, so that the cholesteric liquid crystals films with different rotation directions are designed between adjacent pixels, and one of any two adjacent pixels allows light to pass through, and another one of the two adjacent pixels blocks the light from passing
(Continued)

through and reflects the light back into the display device, thereby achieving an object of reducing crosstalk.

20 Claims, 5 Drawing Sheets

(58) Field of Classification Search
CPC ......... G02F 1/133614; G02F 1/133613; G02F 1/133617; G02F 1/133543; G02F 1/13718; G02F 2201/343; G09G 2300/0486; G09G 2300/0495
See application file for complete search history.

(56) References Cited

U.S. PATENT DOCUMENTS

| | | | |
|---|---|---|---|
| 2016/0223730 A1 | 8/2016 | Kim et al. | |
| 2020/0150470 A1* | 5/2020 | Zhu | G02F 1/133617 |
| 2020/0219937 A1* | 7/2020 | Ahn | H10K 50/865 |
| 2020/0241363 A1* | 7/2020 | Ma | G02F 1/133617 |
| 2021/0382350 A1* | 12/2021 | Chen | G02F 1/1313 |

FOREIGN PATENT DOCUMENTS

| | | | | |
|---|---|---|---|---|
| CN | 105068330 A | | 11/2015 | |
| CN | 105242473 A | | 1/2016 | |
| CN | 106094303 A | | 11/2016 | |
| CN | 108287431 A | | 7/2018 | |
| CN | 109814316 A | | 5/2019 | |
| CN | 111341818 A | | 6/2020 | |
| CN | 111679354 A | | 9/2020 | |
| CN | 213750585 U | | 7/2021 | |
| CN | 113589416 A | | 11/2021 | |
| CN | 113589578 A | | 11/2021 | |
| JP | H06265903 A | | 9/1994 | |
| JP | 2003322850 A | * | 11/2003 | ....... G02F 1/133603 |

OTHER PUBLICATIONS

Written Opinion of the International Search Authority in International application No. PCT/CN2021/140501, mailed on Apr. 26, 2022.
Chinese Office Action issued in corresponding Chinese Patent Application No. 202111525213.2 dated Jul. 11, 2022, pp. 1-7.

* cited by examiner providing a first base, and forming a plurality of light-emitting units on a side of the first base to obtain the first substrate; — S10

providing a second base, and forming a plurality of quantum dot color filters on a side of the second base to obtain a second substrate; and — S20

forming a first cholesteric liquid crystal layer and a second cholesteric liquid crystal layer respectively on surfaces of the first substrate and the second substrate opposite to each other, wherein each of the first cholesteric liquid crystal layer and the second cholesteric liquid crystal layer contains a cholesteric liquid crystal composition, and changing a chiral rotation direction of the cholesteric liquid crystal composition in local areas corresponding to each of the first cholesteric liquid crystal layer and the second cholesteric liquid crystal layer; and — S30

assembling the first substrate and the second substrate to obtain the display device, wherein the cholesteric liquid crystal compositions constitute cholesteric liquid crystals, the cholesteric liquid crystals are provided in the first cholesteric liquid crystal layer and the second cholesteric liquid crystal layer, the first cholesteric liquid crystal layer and the second cholesteric liquid crystal layer collectively constitute a plurality of liquid crystal cells, and the plurality of liquid crystal cells are disposed between the first substrate and the second substrate and in one-to-one correspondence to the plurality of light-emitting units; wherein a chiral rotation direction of the cholesteric liquid crystals in one of the plurality of liquid crystal cells is opposite to a chiral rotation direction of the cholesteric liquid crystals in its adjacent ones of the liquid crystal cells; wherein when blue light emitted by one of the light-emitting units passes through a corresponding one of the liquid crystal cells to obtain a first polarized light, the first polarized light is blocked by another one of the liquid crystal cells adjacent to the corresponding liquid crystal cell; while when the blue light passes through another one of the liquid crystal cells adjacent to the corresponding liquid crystal cell to obtain a second polarized light, the second polarized light is blocked by the corresponding liquid crystal cell. — S40

FIG. 2

DISPLAY PANEL AND MANUFACTURING METHOD THEREOF

BACKGROUND OF INVENTION

Field of Invention

The present application relates to a field of display technology, in particular to a display panel and a manufacturing method thereof.

Description of Prior Art

With rapid development of display technology, liquid crystal display (LCD) has become a mainstream display solution. However, on the other hand, micro light-emitting diode (Micro-LED) display and mini light-emitting diode (Mini-LED) (hereinafter, the Micro-LED and the Mini-LED are collectively referred to as MLED) direct display products are also gradually emerging.

Compared with LCD, the MLED has advantages of high contrast and high brightness. However, because LED full-color display requires three times of printing LEDs, which requires difficult manufacturing processes, and prices of RGB chips of a same specification is R>G>B, so the cost is higher. Compared with three-color LED devices, blue light source (blue MLED or blue OLED) in combination with color conversion technology, that is, blue light exciting a quantum dot conversion layer, is considered to be the one of the next generation display technologies, due to advantages of high color gamut, low cost, and reduced process difficulty.

However, the blue light in combination with the color conversion technology is impacted by lateral light emission of the LEDs, so that crosstalk between LEDs of different colors is serious. When a color conversion layer corresponding to a green pixel is turned on, the lateral light emission of the LEDs will impact other pixels adjacent to the green pixel, resulting in light crosstalk between adjacent pixels. Currently, the industry usually applies black glue or white glue on opposite sides of the LEDs to reduce crosstalk. However, white glue cannot improve crosstalk due to its limited blue light absorption, and the black glue absorbs light and reduces luminous utilization rate of the LEDs.

Therefore, there is an urgent need to develop a display panel and a manufacturing method thereof that can reduce crosstalk.

SUMMARY OF INVENTION

The present application provides a display panel and a manufacturing method thereof, which utilizes circular dichroism of cholesteric liquid crystals, that is, a principle that light whose polarization direction is the same as a chiral rotation direction of the cholesteric liquid crystals is reflected, and light whose polarization direction is different from the chiral rotation direction of the cholesteric liquid crystals is transmitted, thereby providing a method for realizing a design scheme of adjacent pixels having different cholesteric liquid crystals films, so that the cholesteric liquid crystals films with different rotation directions are designed between adjacent pixels, and one of any two adjacent pixels allows light to pass through, and another one of the two adjacent pixels blocks the light from passing through and reflects the light back into the display device, thereby achieving an object of reducing crosstalk.

In a first aspect, an embodiment of the present application provides a display panel, the display panel including:

a first substrate provided with a plurality of light-emitting units;

a second substrate disposed opposite to the first substrate, wherein a plurality of quantum dot color filters are disposed at a side of the second substrate facing the first substrate, and the plurality of quantum dot color filters correspond to the plurality of light-emitting units in one-to-one correspondence; and a plurality of liquid crystal cells disposed between the first substrate and the second substrate and in one-to-one correspondence to the plurality of light-emitting units, wherein each of the plurality of liquid crystal cells includes cholesteric liquid crystals, and a chiral rotation direction of the cholesteric liquid crystals in one of the plurality of liquid crystal cells is opposite to a chiral rotation direction of the cholesteric liquid crystals in its adjacent ones of the liquid crystal cells.

In one embodiment of the present application, the cholesteric liquid crystals are mixed with a photo-isomerizable chiral compound, so that adjacent ones of the plurality of liquid crystal cells have cholesteric liquid crystals with different chiral rotation directions.

In one embodiment of the present application, the photo-isomerizable chiral compound includes an ultraviolet light photo-isomerizable chiral compound, and the ultraviolet light photo-isomerizable chiral compound includes a chiral diarylethylene or a chiral spirene monomer.

In one embodiment of the present application, the plurality of liquid crystal cells are composed of a first cholesteric liquid crystal layer close to the first substrate and a second cholesteric liquid crystal layer close to the second substrate.

In one embodiment of the present application, the plurality of liquid crystal cells include a first liquid crystal cell corresponding to a blue pixel, a second liquid crystal cell corresponding to a green pixel, and a third liquid crystal cell corresponding to a red pixel; and when a chiral rotation direction of the cholesteric liquid crystals in the second liquid crystal cell is one of left-handed or right-handed, a chiral rotation direction of the cholesteric liquid crystals in the first and third liquid crystal cells adjacent to the second liquid crystal cell is another one of left-handed or right-handed.

In one embodiment of the present application, the light-emitting unit is a blue light-emitting unit, and a reflection wavelength of the cholesteric liquid crystals ranges from 380 nm to 780 nm.

In one embodiment of the present application, the light-emitting unit is a blue light-emitting unit, and a reflection wavelength of the cholesteric liquid crystals ranges from 400 nm to 550 nm.

In one embodiment of the present application, the plurality of quantum dot color filters include a first color filter portion, a second color filter portion, and a third color filter portion; the first color filter portion includes a first color filter block and a first color conversion block, the first color filter block is disposed on a side of the second substrate close to the first substrate, and the first color conversion block is disposed on a side of the first color filter block close to the first substrate; the second color filter portion includes a second color filter block and a second color conversion block, the second color filter block is disposed on a side of the second substrate close to the first substrate, and the second color conversion block is disposed on a side of the second color filter block close to the first substrate; and the third color filter portion includes a third color filter block and a light-transmitting block, the third color filter block is disposed on a side of the second substrate close to the first substrate, and the light-transmitting block is disposed on a side of the third color filter block close to the first substrate.

In one embodiment of the present application, the display panel further includes a plurality of black matrices disposed on a side of the second substrate facing the first substrate, and disposed between the plurality of quantum dot color filters.

In a second aspect, another embodiment of the present application provides a method of manufacturing a display panel, the method of manufacturing the display panel includes:

Step S10, providing a first base, and forming a plurality of light-emitting units on a side of the first base to obtain the first substrate;

Step S20, providing a second base, and forming a plurality of quantum dot color filters on a side of the second base to obtain a second substrate; and Step S30, forming a first cholesteric liquid crystal layer and a second cholesteric liquid crystal layer respectively on surfaces of the first substrate and the second substrate opposite to each other, wherein each of the first cholesteric liquid crystal layer and the second cholesteric liquid crystal layer contains a cholesteric liquid crystal composition, and changing a chiral rotation direction of the cholesteric liquid crystal composition in local areas corresponding to each of the first cholesteric liquid crystal layer and the second cholesteric liquid crystal layer; and Step S40, assembling the first substrate and the second substrate to obtain the display device, wherein the cholesteric liquid crystal compositions constitute cholesteric liquid crystals, the cholesteric liquid crystals are provided in the first cholesteric liquid crystal layer and the second cholesteric liquid crystal layer, the first cholesteric liquid crystal layer and the second cholesteric liquid crystal layer collectively constitute a plurality of liquid crystal cells, and the plurality of liquid crystal cells are disposed between the first substrate and the second substrate and in one-to-one correspondence to the plurality of light-emitting units; wherein a chiral rotation direction of the cholesteric liquid crystals in one of the plurality of liquid crystal cells is opposite to a chiral rotation direction of the cholesteric liquid crystals in its adjacent ones of the liquid crystal cells; wherein when blue light emitted by one of the light-emitting units passes through a corresponding one of the liquid crystal cells to obtain a first polarized light, the first polarized light is blocked by another one of the liquid crystal cells adjacent to the corresponding liquid crystal cell; while when the blue light passes through another one of the liquid crystal cells adjacent to the corresponding liquid crystal cell to obtain a second polarized light, the second polarized light is blocked by the corresponding liquid crystal cell.

11. The method of manufacturing a display panel according to claim 8, wherein in the step S30, the cholesteric liquid crystal composition includes: 60 wt %-98.8 wt % of a nematic liquid crystal, 0.5 wt %-30 wt % of a liquid crystal polymerizable monomer, 0.05 wt %-11 wt % of a photo-isomerizable chiral compound, 0.05 wt %-1.5 wt % of an accelerator; and the step S30 further includes:

Step S301: locally performing a first ultraviolet light irradiation on the cholesteric liquid crystal composition in an area of the liquid crystal cells, so that the photo-isomerizable chiral compound in the cholesteric liquid crystal composition in the irradiated area of the liquid crystal cells undergoes isomerization to change the chiral rotation direction of the cholesteric liquid crystal composition; and Step S302, performing a second ultraviolet light irradiation on the cholesteric liquid crystal composition, so that the liquid crystalline polymerizable monomer undergoes a crosslinking reaction to form the cholesteric liquid crystals with a polymer network.

In one embodiment of the present application, in step S301, the first ultraviolet light irradiation is locally performed on at least one of the plurality of liquid crystal cells, and the first ultraviolet light irradiation avoids the liquid crystal cells adjacent to the at least one liquid crystal cell.

In one embodiment of the present application, the cholesteric liquid crystals are mixed with a photo-isomerizable chiral compound, so that adjacent ones of the plurality of liquid crystal cells have cholesteric liquid crystals with different chiral rotation directions.

In one embodiment of the present application, the photo-isomerizable chiral compound includes an ultraviolet light photo-isomerizable chiral compound, and the ultraviolet light photo-isomerizable chiral compound includes a chiral diarylethylene or a chiral spirene monomer.

In one embodiment of the present application, the plurality of liquid crystal cells are composed of a first cholesteric liquid crystal layer close to the first substrate and a second cholesteric liquid crystal layer close to the second substrate.

In one embodiment of the present application, the plurality of liquid crystal cells include a first liquid crystal cell corresponding to a blue pixel, a second liquid crystal cell corresponding to a green pixel, and a third liquid crystal cell corresponding to a red pixel; and when a chiral rotation direction of the cholesteric liquid crystals in the second liquid crystal cell is one of left-handed or right-handed, a chiral rotation direction of the cholesteric liquid crystals in the first and third liquid crystal cells adjacent to the second liquid crystal cell is another one of left-handed or right-handed.

In one embodiment of the present application, the light-emitting unit is a blue light-emitting unit, and a reflection wavelength of the cholesteric liquid crystals ranges from 380 nm to 780 nm.

In one embodiment of the present application, the light-emitting unit is a blue light-emitting unit, and a reflection wavelength of the cholesteric liquid crystals ranges from 400 nm to 550 nm.

In one embodiment of the present application, the plurality of quantum dot color filters include a first color filter portion, a second color filter portion, and a third color filter portion; the first color filter portion includes a first color filter block and a first color conversion block, the first color filter block is disposed on a side of the second substrate close to the first substrate, and the first color conversion block is disposed on a side of the first color filter block close to the first substrate; the second color filter portion includes a second color filter block and a second color conversion block, the second color filter block is disposed on a side of the second substrate close to the first substrate, and the second color conversion block is disposed on a side of the second color filter block close to the first substrate; and the third color filter portion includes a third color filter block and a light-transmitting block, the third color filter block is disposed on a side of the second substrate close to the first substrate, and the light-transmitting block is disposed on a side of the third color filter block close to the first substrate.

In one embodiment of the present application, the display panel further includes a plurality of black matrices disposed on a side of the second substrate facing the first substrate, and disposed between the plurality of quantum dot color filters.

In the display panel and the manufacturing method thereof provided by the present application, which utilize circular dichroism of cholesteric liquid crystals, that is, a principle that light whose polarization direction is the same as a chiral rotation direction of the cholesteric liquid crystals is reflected, and light whose polarization direction is different from the chiral rotation direction of the cholesteric liquid crystals is transmitted, thereby providing a method for realizing a design scheme of adjacent pixels having different cholesteric liquid crystals films. Such a design scheme adopts a photo-isomerizable chiral compound in the cholesteric liquid crystals, and adopts local photoisomerization and thermal polymerization methods to realize patterning of cholesteric liquid crystals in different regions, and the design scheme is applied to a display device with a blue light backplane and a quantum dot color conversion layer, so that the cholesteric liquid crystals films with different rotation directions are designed between adjacent pixels, and one of any two adjacent pixels allows light to pass through, and another one of the two adjacent pixels blocks the light from passing through and reflects the light back into the display device, thereby achieving an object of reducing crosstalk.

Other features and advantages of the present invention will be described in the following description, and partly become obvious from the description, or understood by implementing the present invention. The object and other advantages of the present invention can be realized and obtained through the structures specifically pointed out in the specification, claims and drawings.

BRIEF DESCRIPTION OF DRAWINGS

In order to more clearly illustrate the technical solutions of the embodiments of the present application, the drawings illustrating the embodiments will be briefly described below.

FIG. 2 is a flow diagram showing steps of a method of manufacturing a display panel according to an embodiment of the present application.

DETAILED DESCRIPTION OF PREFERRED EMBODIMENTS

Figure 1:
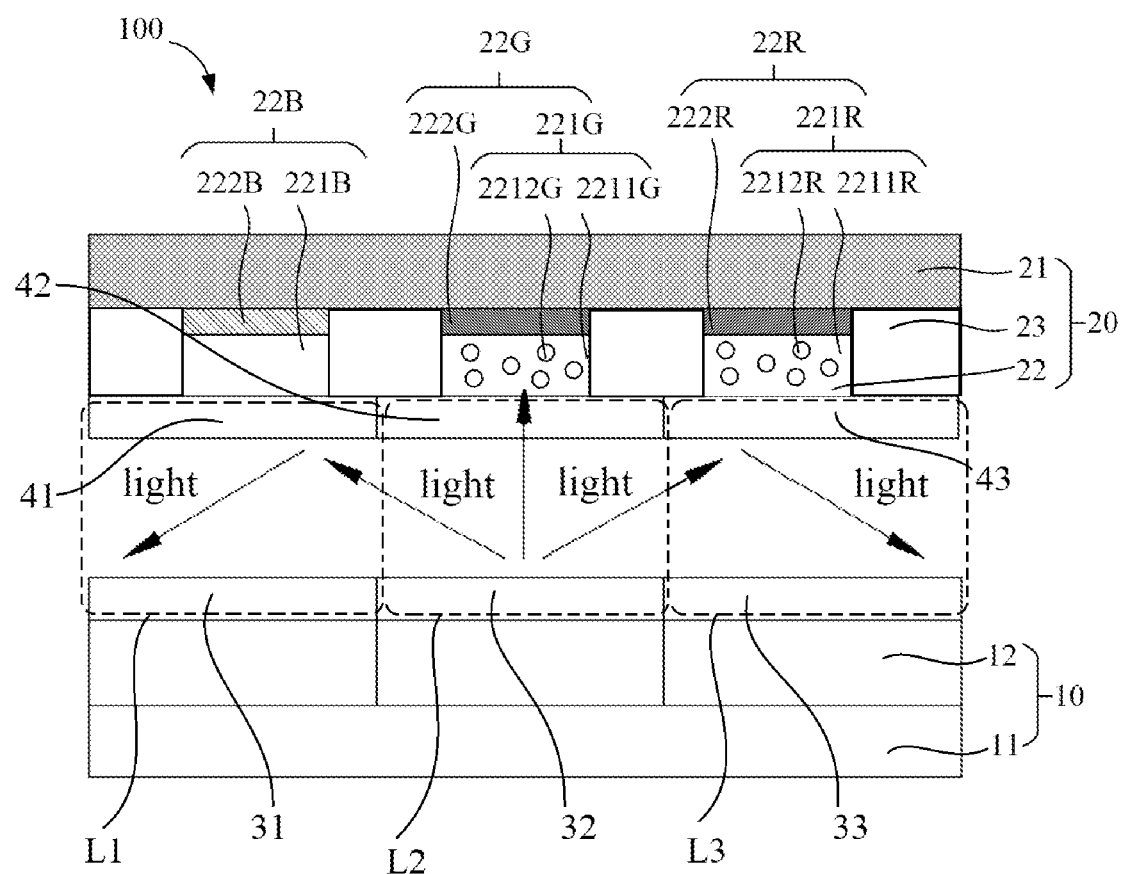
FIG. 1 is a schematic structural diagram of a display panel according to an embodiment of the present application.

The implementation of the present invention will be described in detail below with reference to the accompanying drawings and embodiments, so as to fully understand how the present invention applies technical means to solve technical problems and achieve the realization process of technical effects and implement them accordingly. It should be noted that, as long as there is no conflict, embodiments of the present invention and features in each embodiment can be combined with each other, and the technical solutions obtained are all within the protection scope of the present invention.

Meanwhile, in the following description, many specific details are set forth for the purpose of explanation to provide a thorough understanding of the embodiments of the present invention. However, it is obvious to those skilled in the art that the present invention can be implemented without the specific details of the embodiments or the specific manners described.

In the present invention, unless otherwise expressly stated and limited, the formation of a first feature over or under a second feature in the description that follows may include embodiments in which the first and second features are formed in direct contact, and may also include embodiments in which additional features may be formed between the first and second features, such that the first and second features may not be in direct contact. Moreover, the first feature "above", "over" and "on" the second feature includes the first feature directly above and above the second feature, or merely indicating that the first feature is at a level higher than the second feature. The first feature "below", "under" and "beneath" the second feature includes the first feature directly below and obliquely below the second feature, or merely the first feature has a level lower than the second feature.

In order to achieve an object of reducing crosstalk, the present application provides a display panel and a manufacturing method thereof, which utilizes circular dichroism of cholesteric liquid crystals, that is, a principle that light whosepolarization direction is the same as a chiral rotation direction of the cholesteric liquid crystals is reflected, and light whose polarization direction is different from the chiral rotation direction of the cholesteric liquid crystals is transmitted, thereby providing a method for realizing a design scheme of adjacent pixels having different cholesteric liquid crystals films, so that the cholesteric liquid crystals films with different rotation directions are designed between adjacent pixels, and one of any two adjacent pixels allows light to pass through, and another one of the two adjacent pixels blocks the light from passing through and reflects the light back into the display device, thereby achieving the object of reducing crosstalk.

The display panel in embodiments of the present application can be used in mobile phones, tablet computers, e-readers, electronic display screens, notebook computers, mobile phones, augmented reality (AR)/virtual reality (VR) devices, media playback devices, wearable devices, digital cameras, car navigation devices, etc.

Referring to FIG. 1, FIG. 1 is a schematic structural diagram of a display panel according to an embodiment of the present application. As shown in FIG. 1, in order to achieve the above object, an embodiment of the present application provides a display panel 100. The display panel 100 includes: a first substrate 10; a second substrate 20 disposed opposite to the first substrate 10, and a plurality of liquid crystal cells L1/L2/L3, disposed between the first substrate 10 and the second substrate 20. In detail, the first substrate 10 is provided with a plurality of light emitting units 12; the second substrate 20 is provided with a plurality of quantum dot color filters 22 on a side of the second substrate 20 facing the first substrate 10, wherein the plurality of quantum dot color filters 22 correspond to the plurality of light-emitting units 12 in one-to-one correspondence; and the plurality of liquid crystal cells L1/L2/L3 correspond to the plurality of light-emitting units 12 in one-to-one correspondence. Each of the plurality of liquid crystal cells L1/L2/L3 includes cholesteric liquid crystals, and a chiral rotation direction of the cholesteric liquid crystals in one of the plurality of liquid crystal cells L1/L2/L3 is opposite to a chiral rotation direction of the cholesteric liquid crystals in its adjacent ones of the liquid crystal cells. When blue light emitted by one of the light-emitting units 12 passes through a corresponding one of the liquid crystal cells to obtain a first polarized light, the first polarized light is blocked by another one of the liquid crystal cells adjacent to the corresponding liquid crystal cell; while when the blue light passes through another one of the liquid crystal cells adjacent to the corresponding liquid crystal cell to obtain a second polarized light, the second polarized light is blocked by the corresponding liquid crystal cell.

Still referring to FIG. 1, specifically, in one embodiment of the present application, the first substrate 10 includes a first base 11 and the plurality of light-emitting units 12 disposed on the first base 11; wherein the first base 11 may be made of glass, plastic, or other commonly used substrate materials in the industry; the plurality of light-emitting units 12 may be arranged on the first base 11 in a matrix, and the light-emitting unit 12 may be a Micro-LED chip or a Mini-LED chip. Optionally, the plurality of light-emitting units 12 may be light-emitting chips of the same color or different colors. Preferably, the plurality of light-emitting units 12 are blue light-emitting units 12.

In an embodiment of the present application, the cholesteric liquid crystals contain a photo-isomerizable chiral compound, so that adjacent ones of the plurality of liquid crystal cells L1/L2/L3 can have cholesteric liquid crystals with different rotation directions.

Cholesteric liquid crystals is a type of soft photonic crystals with a periodic helical superstructure, which can selectively reflect light of different wavelengths to produce structural colors. Cholesteric liquid crystals can be prepared by doping light-responsive chiral molecules in nematic liquid crystals. Under stimulation of an external light source, the spatial structure of the light-responsive chiral molecules are changed, which induces changes in pitches of their helical superstructure, thereby regulating a wavelength of light reflected by the cholesteric liquid crystals. The wavelength $\lambda$ of the reflected light of the cholesteric liquid crystals satisfies a Bragg formula of crystal diffraction as follows:

$$\lambda = 2np \sin \varphi.$$

In the formula, $\lambda$ is a wavelength of the reflected light, n is an average refractive index, p is a pitch of the cholesteric liquid crystals, and $\varphi$ is an angle between the incident light and a surface of the liquid crystals. The pitch P is an interlayer spacing at which directors of different layers are rotated 3600 in a helical direction and then return to their initial direction.

It should be noted that the cholesteric liquid crystals have a planar state and a focal conic state. Both planar and focal conic cholesteric liquid crystals can reflect light, and the planar cholesteric liquid crystals have a better reflection effect. In this embodiment, the planar cholesteric liquid crystals are preferably selected, but the present application is not particularly limited thereto. Since the selective reflection phenomenon of the planar cholesteric liquid crystals is very sensitive to a pitch of the liquid crystals, the pitch of the cholesteric liquid crystals can be changed by adjusting a temperature or an electric field, thereby controlling a reflective cholesteric liquid crystal device to emit light of different colors.

It is appreciated that, in the present application, an alignment layer (not shown) for controlling an alignment direction of the cholesteric liquid crystals may also be formed on each of sides of the first substrate 10 and the second substrate 20 opposite to each other, and cholesteric liquid crystals are arranged above the alignment layer.

In an embodiment of the present application, the photo-isomerizable chiral compound includes an ultraviolet light photo-isomerizable chiral compound, and the ultraviolet light photo-isomerizable chiral compound includes a chiral diarylethylene or a chiral spirene monomer.

In some specific embodiments of the present application, a content of the photo-isomerizable chiral compound can be adjusted according to a reflection band of the cholesteric liquid crystals, which can be 380 nm to 780 nm, that is, the cholesteric liquid crystals can reflect light in a range of visible light; and preferably light in a range of blue light, that is, light having a reflection band of 400 nm to 550 nm.

Still referring to FIG. 1, in an embodiment of the present application, the plurality of liquid crystal cells L1/L2/L3 are composed of first cholesteric liquid crystal layers 31/32/33 close to the first substrate 10 and second cholesteric liquid crystal layers 41/42/43 close to the second substrate 20.

As shown in FIG. 1, further, in a specific embodiment of the present application, the plurality of liquid crystal cells L1/L2/L3 are composed of first cholesteric liquid crystal layers 31/32/33 close to the first substrate 10 and second cholesteric liquid crystal layers 41/42/43 close to the second substrate 20; wherein the plurality of liquid crystal cells L1/L2/L3 include a first liquid crystal cell L1 corresponding to a blue pixel, a second liquid crystal cell L2 corresponding to a green pixel, and a third liquid crystal cell L3 corresponding to a red pixel. In this embodiment, the first cholesteric liquid crystal layers 31/32/33 include the first cholesteric liquid crystal layer 31 corresponding to the blue pixel, the first cholesteric liquid crystal layer 32 corresponding to the green pixel, and the first cholesteric liquid crystal layer 33 corresponding to the red pixel; the second cholesteric liquid crystal layers 41/42/43 include the second cholesteric liquid crystal layer 41 corresponding to the blue pixel, the second cholesteric liquid crystal layer 42 corresponding to the green pixel, and the second cholesteric liquid crystal layer 43 corresponding to the red pixel.

It can be seen from FIG. 1 that the first liquid crystal cell L1 is composed of the first cholesteric liquid crystal layer 31 corresponding to the blue pixel and the second cholesteric liquid crystal layer 41 corresponding to the blue pixel; the second liquid crystal cell L2 is composed of the first cholesteric liquid crystal layer 32 corresponding to the green pixel and the second cholesteric liquid crystal layer 42 corresponding to the green pixel; and the third liquid crystal cell L3 is composed of the first cholesteric liquid crystal layer 33 corresponding to the red pixel and the second cholesteric liquid crystal layer 43 corresponding to the red pixel.

Referring to FIG. 1, based on the principle disclosed in the foregoing embodiments, it is appreciated that, taking the green pixel as an example, a chiral rotation direction (for example, left-handed) of the cholesteric liquid crystals in the second liquid crystal cell L2 is opposite to chiral rotation directions (for example, right-handed) of the cholesteric liquid crystals in the first liquid crystal cell L1 and the third liquid crystal cell L3 which are adjacent to the second liquid crystal cell L2. When blue light emitted by the light-emitting unit 12 corresponding to the second liquid crystal cell L2 passes through the second liquid crystal cell L2 to obtain a first polarized light (for example, right-handed circularly polarized light), the first polarized light is blocked by the cholesteric liquid crystals in the first liquid crystal cell L1 and the third liquid crystal cell L3 which are adjacent to the second liquid crystal cell L2; while when the blue light passes through the cholesteric liquid crystals in the first liquid crystal cell L1 and the third liquid crystal cell L3 which are adjacent to the second liquid crystal cell L2 to obtain a second polarized light (for example, left-handed circularly polarized light), the second polarized light is blocked by the second liquid crystal cell L2.

As shown in FIG. 1, in an embodiment of the present application, the second substrate 20 includes: a second base 21, the plurality of quantum dot color filters 22 disposed on the second base 21, and a black matrix 23 arranged between the plurality of quantum dot color filters 22.

As shown in FIG. 1, further, in a specific embodiment of the present invention, the plurality of quantum dot color films 22 include a first color filter portion 22B, a second color filter portion 22G, and a third color filter portion 22R; the first color filter portion 22B includes a first color filter block 222B and a first transparent matrix 221B, the first color filter block 222B is disposed on the side of the second substrate 20 close to the first substrate 10, and the first transparent substrate 221B is disposed on a side of the first color filter block 222B close to the first substrate 10; the second color filter portion 22G includes a second color filter block 222G and a second color conversion block 221G, the second color filter block 222G is disposed on the side of the second substrate 20 close to the first substrate 10, and the second color conversion block 221G is disposed on a side of the second color filter block 222G close to the first substrate 10; and the third color filter portion 22R includes a third color filter block 222R and a third color conversion block 221R, the third color filter block 222R is disposed on the side of the second substrate 20 close to the first substrate 10, and the third color conversion block 221R is disposed on a side of the third color filter block 222R close to the first substrate 10.

In the above specific embodiment, the first color filter portion 22B is a blue color filter portion, the second color filter portion 22G is a green color filter portion, and the third color filter portion 22R is a red color filter portion. The first color filter block 222B is a blue color filter block. The first transparent matrix 221B may not be added with quantum dots. The second color filter block 222G is a green color filter block, and the second color conversion block 221G includes a second transparent matrix 2211G and green quantum dots 2212G dispersed in the second transparent matrix 2211G. The third color filter block 222R is a red color filter block, and the third color conversion block 221R includes a third transparent matrix 2211R and red quantum dots 2212R dispersed in the third transparent matrix 2211R. The second color filter 22G and the third color filter 22R may also be referred to as QDCF films. It is appreciated that color conversion particles in the color conversion block may also be materials other than quantum dots, such as phosphors.

When the display panel 100 is working, the blue light emitting unit 12 emits blue light, and the blue light emitted by the light emitting unit 12 corresponding to the first color filter portion 22B passes through the first transparent substrate 221B, and then is emitted through the first transparent substrate 221B. The blue light emitted by the light emitting unit 12 corresponding to the second color filter portion 22G can be converted into green light by the green quantum dots 2212G in the second color conversion block 221G, and then emitted through the second color filter block 222G. The blue light emitted by the light emitting unit 12 corresponding to the third color filter portion 22R can be converted into red light by the red quantum dots 2212R in the third color conversion block 221R, and then emitted through the third color filter block 222R.

In view of above, similarly, when the light-emitting unit 12 corresponding to the second color filter portion 22G is turned on, and the light-emitting units 12 corresponding to the third color filter portion 22R and the first color filter portion 22B are also turned on, the light emitted by the light emitting units 12 corresponding to the third color filter portion 22R and the first color filter portion 22B is reflected by their corresponding second cholesteric liquid crystal layer 41/43 to their corresponding color filter portions respectively (the third color filter portion 22R and the first color filter portion 22B), thereby avoiding crosstalk between adjacent sub-pixels. When the light emitting unit 12 corresponding to the second color filter portion 22G is turned on and the light emitting units 12 corresponding to the third color filter portion 22R and the first color filter portion 22B are turned off, the blue light emitted by the light emitting unit 12 corresponding to the second color filter portion 22G is not only emitted in a vertical direction, but also emitted in an oblique direction or a lateral direction. The vertical direction here refers to a direction perpendicular to the first base 11, the oblique direction is a direction intersecting but not perpendicular to the vertical direction, and the lateral direction refers to a direction parallel to the first base 11.

Still referring to FIG. 1, taking the green pixel as an example, the blue light passes through the first cholesteric liquid crystal layer 32 corresponding to the green pixel and is then converted into, for example, right-handed circularly polarized light (cholesteric circular dichroism: light of a same polarization direction is reflected, and light of different polarization directions passes through); right-handed circularly polarized light can pass through the left-handed second cholesteric liquid crystal layer 42 corresponding to the green pixel, that is, pass through the green pixel; while the light of pixels adjacent to the green pixel is reflected back by the right-handed second cholesteric liquid crystal layers 41/43 corresponding to the blue pixel and the red pixel (light of the same polarization direction is reflected); thereby achieving the crosstalk effect. In particular, a reflection band of the the second cholesteric liquid crystal layers 41/42/43 (close to the second substrate 20) can be a full band (ranging from 380 nm to 780 nm), so that the light emitted by the quantum dots excited by the blue light is reflected out of the second substrate 20 (reflected out of the display panel) in a direction away from the first substrate 10. White glue used in the prior art has a poor absorption for light, especially blue light. In this embodiment, cholesteric liquid crystals are designed to selectively reflect the blue light, which can increase a reflectivity of light and reduce crosstalk and light leakage between adjacent sub-pixels.

It should be noted that in the display panel provided by the present application, the second cholesteric liquid crystal layers 41/42/43 close to the quantum dot color filter 22 can reflect green light and red light, which can further achieve the purpose of improving light efficiency. That is, the green light and red light converted by the quantum dot color filter 22 can be reflected outward by the second cholesteric liquid crystal layers 41/42/43, so that the first cholesteric liquid crystal layers 31/32/33 and the second cholesteric liquid crystal layers 41/42/43 having different compositions from the first cholesteric liquid crystal layers 31/32/33 have different effects. However, in the present application, the first cholesteric liquid crystal layers 31/32/33 and the second cholesteric liquid crystal layers 41/42/43 can use the same or different materials and compositions, as long as the first cholesteric liquid crystal layers 31/32/33 and the second cholesteric liquid crystal layers 41/42/43 can reflect the blue light of different polarization directions, and the effect of improving the crosstalk can be achieved, and the present application does not particularly limited thereto.

Referring to FIGS. 2-7, FIG. 2 is a flow diagram showing steps of a method of manufacturing a display panel according to an embodiment of the present application; and FIGS. 3-7 are schematic structural diagrams showing the display panel in each of the steps of the manufacturing method according to an embodiment of the present application. As shown in FIGS. 2-7, another embodiment of the present application provides a method of manufacturing a display panel 100, and the method of manufacturing the display panel 100 includes the steps as follows.

Figure 3:
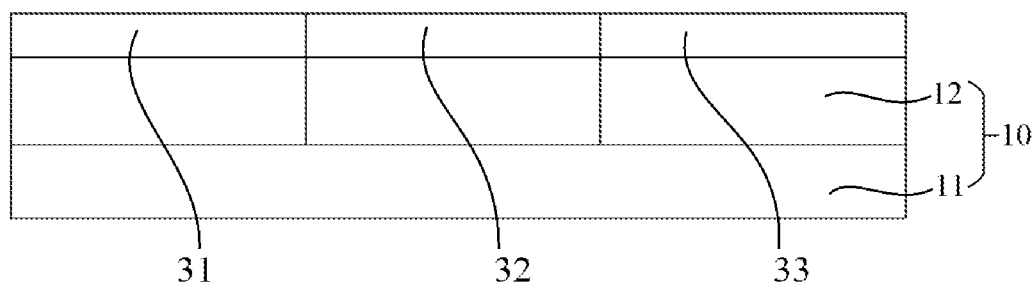
FIGS. 3-7 are schematic structural diagrams showing the display panel in various steps of the manufacturing method according to an embodiment of the present application.

Step S10, referring to FIG. 3, providing a first base 11, and forming a plurality of light-emitting units 12 on a side of the first base 11 to obtain the first substrate 10.

Figure 4:
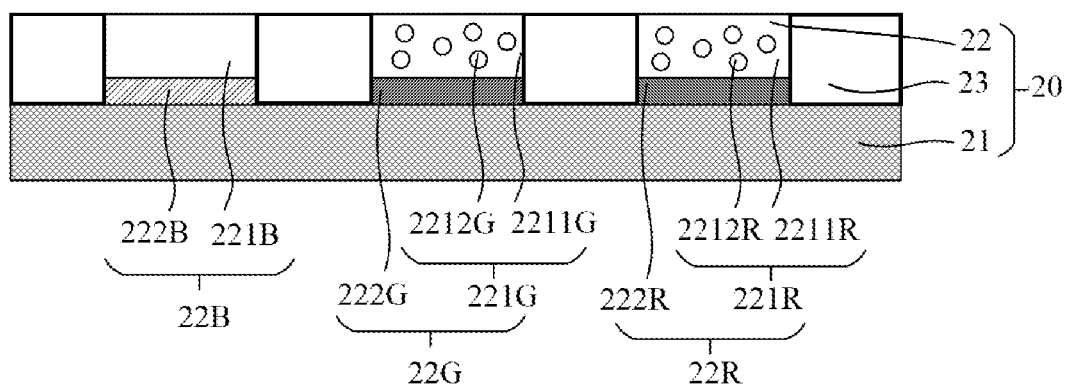

Step S20, referring to FIG. 4, providing a second base 21, and forming a plurality of quantum dot color filters 22 on a side of the second base 21 to obtain a second substrate 20.

Figure 5:
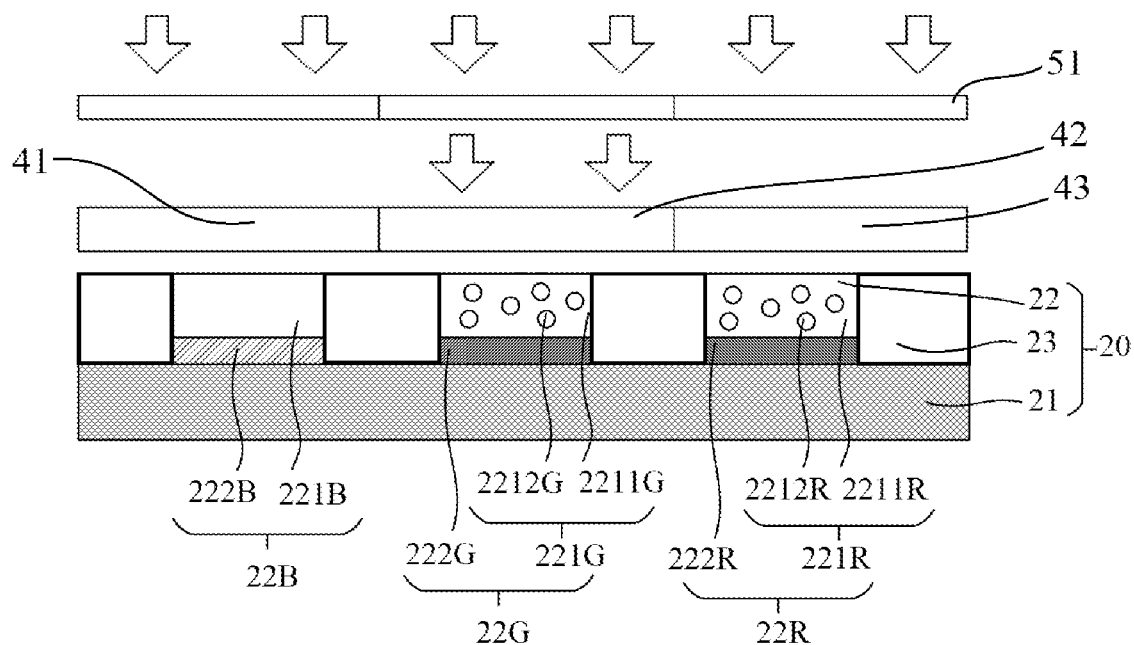
Figure 6:
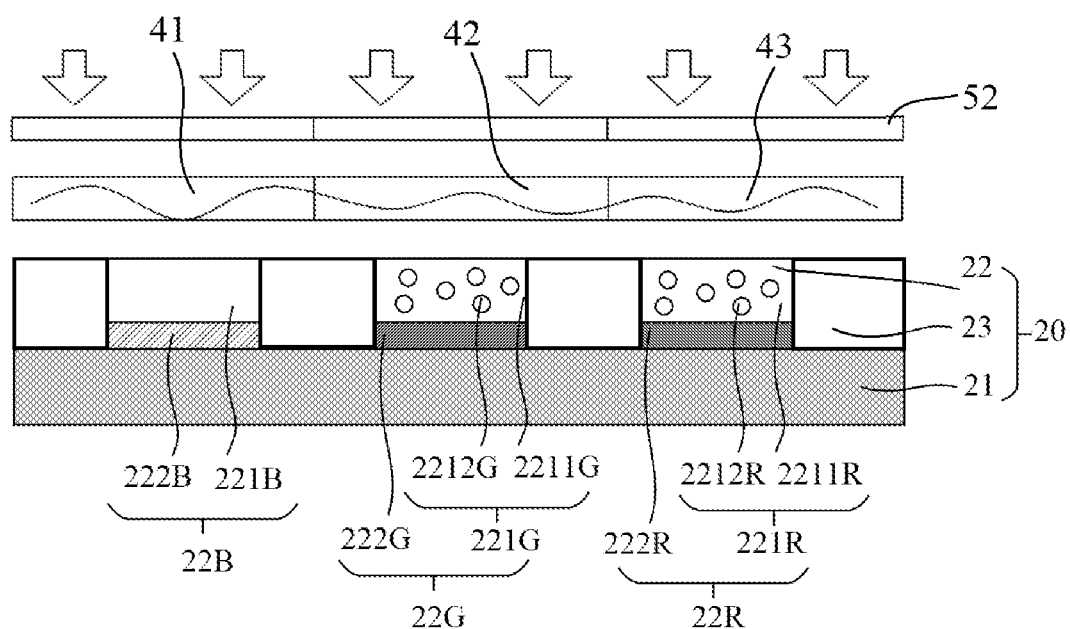

Step S30, referring to FIGS. 5-6, forming first cholesteric liquid crystal layers 31/32/33 and second cholesteric liquid crystal layers 41/42/43 respectively on surfaces of the first substrate and the second substrate opposite to each other, wherein each of the first cholesteric liquid crystal layers 31/32/33 and the second cholesteric liquid crystal layers 41/42/43 contains a cholesteric liquid crystal composition, and changing a chiral rotation direction of the cholesteric liquid crystal composition in local areas corresponding to each of the first cholesteric liquid crystal layers 31/32/33 and the second cholesteric liquid crystal layers 41/42/43. In an embodiment of the present application, in the step S30, the cholesteric liquid crystal composition includes: 60 wt %-98.8 wt % of a nematic liquid crystal, 0.5 wt %-30 wt % of a liquid crystal polymerizable monomer, 0.05 wt %-11 wt % of a photo-isomerizable chiral compound, 0.05 wt %-1.5 wt % of an accelerator. Specifically, the method of preparing the cholesteric liquid crystal polymer is to heat and mix uniformly the liquid crystal polymerizable monomer, the negative liquid crystal, the photo-isomerizable chiral compound, and the accelerator according to a certain ratio. It should be noted that although the foregoing embodiments only use the negative liquid crystal as an example, the present application is not particularly limited thereto, that is, a positive liquid crystal can also be used instead.

Still referring to FIGS. 5-6, in an embodiment of the present application, the step S30 further includes:

Step S301, as shown in FIG. 5, locally performing a first ultraviolet light irradiation (represented by the arrow in FIG. 5) on the cholesteric liquid crystal composition in an area of the liquid crystal cells with a first photomask 51, so that the photo-isomerizable chiral compound in the cholesteric liquid crystal composition in the irradiated area of the liquid crystal cells undergoes isomerization to change the chiral rotation direction of the cholesteric liquid crystal composition. In an embodiment of the present application, the photo-isomerizable chiral compound includes an ultraviolet light photo-isomerizable chiral compound, and the ultraviolet light photo-isomerizable chiral compound includes a chiral diarylethylene or a chiral spirene monomer. Specifically, a content of the photo-isomerizable chiral compound can be adjusted according to a reflection band of the cholesteric liquid crystals, which can be 380 nm to 780 nm, that is, the cholesteric liquid crystals can reflect light in a range of visible light; and preferably light in a range of blue light, that is, light having a reflection band of 400 nm to 550 nm. It should be noted that the content of the photo-isomerizable chiral compound will affect the reflection band of the cholesteric liquid crystals, and the more the content of the photo-isomerizable chiral compound, the smaller the reflection band.

In an embodiment of the present application, in step S301, the first ultraviolet light irradiation is locally performed on at least one of the plurality of liquid crystal cells L1/L2/L3, and the first ultraviolet light irradiation avoids the liquid crystal cells adjacent to the at least one liquid crystal cell.

Referring to FIG. 5, in a specific embodiment of the present invention, the step S301 includes: locally performing a first ultraviolet light irradiation (represented by the arrow in FIG. 5) on the cholesteric liquid crystal composition in the second liquid crystal cell L2 with the first photomask 51, and the first ultraviolet light irradiation avoids the first liquid crystal cell L1 and the third liquid crystal cell L3 adjacent to the second liquid crystal cell L2, so that the photo-isomerizable chiral compound in the cholesteric liquid crystal composition in the irradiated area (the second liquid crystal cell L2) undergoes isomerization to change the chiral rotation direction of the cholesteric liquid crystal composition, for example, from a right-handed rotation direction to a left-handed rotation direction; that is, the first ultraviolet light irradiation is locally performed corresponding to the second liquid crystal cell L2, and the first ultraviolet light irradiation avoids the liquid crystal cells adjacent to the at least one liquid crystal cell.

performing a second ultraviolet light irradiation (indicated by the arrow in FIG. 6) on the cholesteric liquid crystal composition, so that the liquid crystalline polymerizable monomer undergoes a crosslinking reaction to form the cholesteric liquid crystals with a polymer network with a second photomask 52, thereby forming a polymer network to stabilize the cholesteric liquid crystals in a horizontally aligned planar texture. In some specific embodiments, operating conditions for polymerizing the liquid crystal polymerizable monomers to undergo the crosslinking reaction are as follows: a thermal polymerization temperature ranges from 90° C. to 150° C., preferably 120° C.; and a thermal polymerization time ranges from 10 min to 150 min, preferably 60 min. In some embodiments of the present application, the polymerizable monomer is a thermal-polymerizable monomer, and the polymer liquid crystal is realized by heating and polymerization, and the cholesteric liquid crystal structure is stabilized. Specifically, the polymerizable monomer can be selected from the following group consisting of: acrylate and its derivatives, methacrylate and its derivatives, styrene and its derivatives, fatty amines, epoxy resins, and mercaptan crosslinking agent. It should be noted that although the above embodiments only take thermal-polymerizable monomers as an example, but the present application is not particularly limited thereto. The polymerizable monomers of the present application can also be replaced by photopolymerizable monomers, and even if a wavelength of the light required for the polymerization of the polymerized monomer is different from a wavelength of the light required for the isomerization of the chiral compound, the technical effect desired by the present application can be still achieved and the technical problem to be solved by the present application can be still solved. In some embodiments of the present application, the accelerator may be selected from the group consisting of azo initiators, peroxide initiators, and redox initiators.

It should be noted that although FIGS. 5-6 only illustrate the formation of a second cholesteric liquid crystal layers 41/42/43 containing a cholesteric liquid crystal composition on the surface of the second substrate 20, referring to FIGS. 5-6, a person having ordinary skill in the art can understand that a technique similar to that shown in the manufacturing steps of FIGS. 5-6 can be used to form the first cholesteric liquid crystal layer 31/32/33 containing the cholesteric liquid crystal composition on the surface of the first substrate 10.

Figure 7:
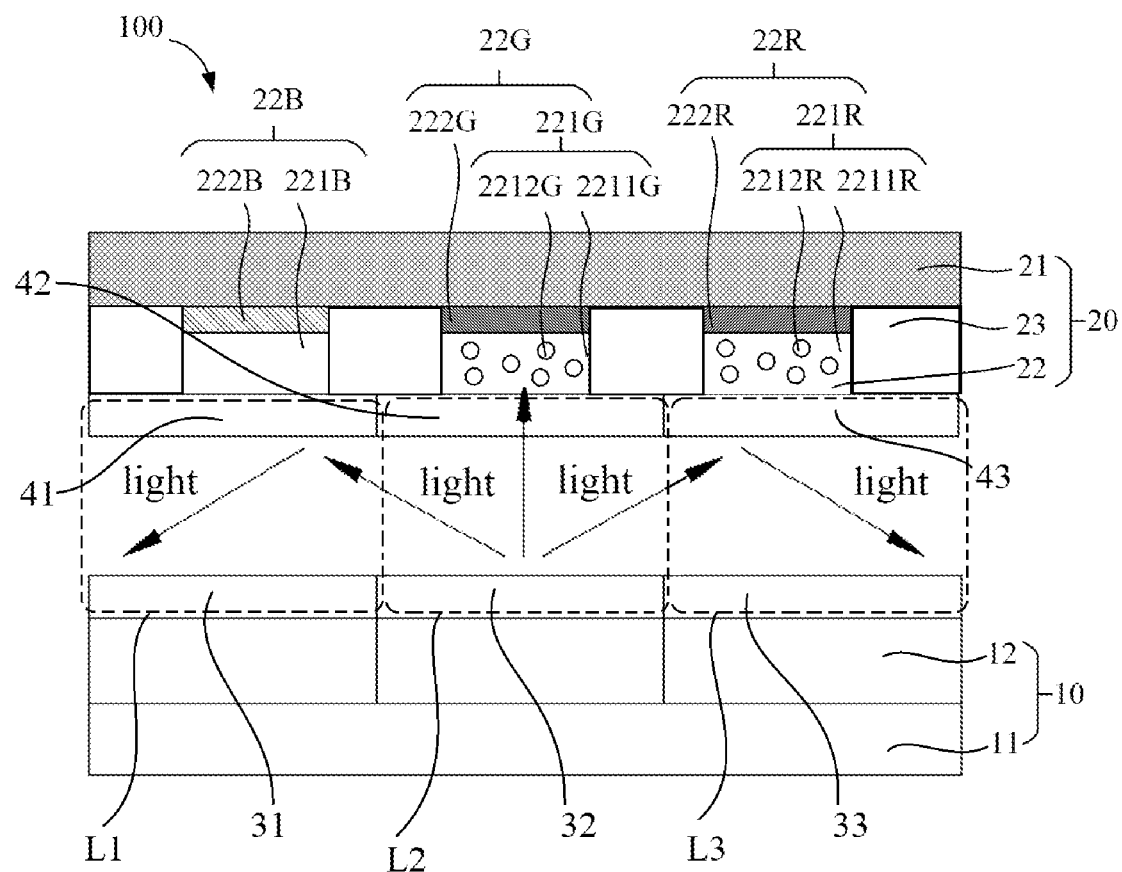

The method of manufacturing the display panel 100 in the embodiment of the present application further includes: step S40, referring to FIG. 7, assembling the first substrate 10 and the second substrate 20 to obtain the display device, wherein the cholesteric liquid crystal compositions constitute cholesteric liquid crystals, the cholesteric liquid crystals are provided in the first cholesteric liquid crystal layers 31/32/33 and the second cholesteric liquid crystal layers 41/42/43, the first cholesteric liquid crystal layers 31/32/33 and the second cholesteric liquid crystal layers 41/42/43 collectively constitute a plurality of liquid crystal cells L1/L2/L3. The plurality of liquid crystal cells L1/L2/L3 are disposed between the first substrate 10 and the second substrate 20 and in one-to-one correspondence to the plurality of light-emitting units 12; wherein a chiral rotation direction of the cholesteric liquid crystals in one of the plurality of liquid crystal cells L1/L2/L3 is opposite to a chiral rotation direction of the cholesteric liquid crystals in its adjacent ones of the liquid crystal cells; wherein when blue light emitted by one of the light-emitting units 12 passes through a corresponding one of the liquid crystal cells to obtain a first polarized light, the first polarized light is blocked by another one of the liquid crystal cells adjacent to the corresponding liquid crystal cell; while when the blue light passes through another one of the liquid crystal cells adjacent to the corresponding liquid crystal cell to obtain a second polarized light, the second polarized light is blocked by the corresponding liquid crystal cell.

Referring to FIG. 7, based on the principle disclosed in the foregoing embodiments, it is appreciated that taking the green pixel as an example, a chiral rotation direction (left-handed rotation direction) of the cholesteric liquid crystals in the second liquid crystal cell L2 is opposite to a chiral rotation direction (right-handed rotation direction) of the cholesteric liquid crystals in the first liquid crystal cell L1 and the third liquid crystal cell L3 which are adjacent to the second liquid crystal cell L2. When blue light emitted by the light-emitting unit 12 corresponding to the second liquid crystal cell L2 passes through the second liquid crystal cell L2 to obtain a first polarized light (right-handed circularly polarized light), the first polarized light is blocked by the cholesteric liquid crystals in the first liquid crystal cell L1 and the third liquid crystal cell L3 which are adjacent to the second liquid crystal cell L2; while when the blue light passes through the cholesteric liquid crystals in the first liquid crystal cell L1 and the third liquid crystal cell L3 which are adjacent to the second liquid crystal cell L2 to obtain a second polarized light (left-handed circularly polarized light), the second polarized light is blocked by the second liquid crystal cell L2.

It should be noted that although in the foregoing embodiments, only three liquid crystal cells and three color filter portions corresponding to each other are taken as examples for description, those skilled in the art should understand that the liquid crystal cells and the color filter portions of the display panel provided by the present application are not particularly limited to three types, but can also include two, four, five, and six types of liquid crystal cells and color filter portions that correspond to each other, as long as these solutions can enable one of any two adjacent pixels of the display device to allow light to pass through, and another one of the two adjacent pixels can block the light from passing and reflect the light back into the display device, thereby achieving the purpose of reducing crosstalk.

It is appreciated that, in order to achieve better alignment, in some embodiments of the present application, an alignment layer (not shown) may be coated on each of the first substrate 10 and the second substrate 20, and the alignment layer is a horizontal alignment layer, and then the cholesteric liquid crystal composition is coated on the alignment layer. After coating, heating is performed to reach a clearing point of the liquid crystal followed by cooling to room temperature, wherein heating is performed generally to about 80° C. followed by cooling to room temperature. However, the liquid crystals with different compositions have different clearing points, resulting in different conditions required. Finally, the cholesteric liquid crystals can be completely horizontally aligned to obtain the cholesteric liquid crystals.

It should be noted that the above-mentioned method of manufacturing the display panel 100 disclosed in the present application, as well as the components involved in the related reference numbers, as long as the parts are the same or similar to those in the foregoing embodiments, can be referred to the contents disclosed in the foregoing embodiments, and the contents, including the nature of the components and the principle of operation, can be adopted in the same way, and will not be repeated herein.

In the display panel and the manufacturing method thereof provided by the present application, which utilize circular dichroism of cholesteric liquid crystals, that is, a principle that light whose polarization direction is the same as a chiral rotation direction of the cholesteric liquid crystals is reflected, and light whose polarization direction is different from the chiral rotation direction of the cholesteric liquid crystals is transmitted, thereby providing a method for realizing a design scheme of adjacent pixels having different cholesteric liquid crystals films. Such a design scheme adopts a photo-isomerizable chiral compound in the cholesteric liquid crystals, and adopts local photoisomerization and thermal polymerization methods to realize patterning of cholesteric liquid crystals in different regions, and the design scheme is applied to a display device with a blue light backplane and a quantum dot color conversion layer, so that the cholesteric liquid crystals films with different rotation directions are designed between adjacent pixels, and one of any two adjacent pixels allows light to pass through, and another one of the two adjacent pixels blocks the light from passing through and reflects the light back into the display device, thereby achieving an object of reducing crosstalk.

In addition, the features of each embodiment can be combined arbitrarily to form a new embodiment, and all new embodiments formed by the combination fall within the protection scope of the present invention. The described features or characteristics may be combined into one or more embodiments in any other suitable manner. In the above description, some specific details are provided, such as thickness, quantity, etc., in order to provide a comprehensive understanding of the embodiments of the present invention. However, those skilled in the relevant art will understand that the present invention can be implemented without one or more of the above specific details, or it can be implemented by other methods, components, materials, etc.

Although the above examples are used to illustrate the principles of the present invention in one or more applications, for those skilled in the art, without departing from the principles and ideas of the present invention, it is obvious that various modifications can be made in the form, usage, and implementation details without creative work. Therefore, the present invention is defined by the appended claims.

What is claimed is:

1. A display panel, the display panel comprising:
   a first substrate provided with a plurality of light-emitting units;
   a second substrate disposed opposite to the first substrate, wherein a plurality of quantum dot color filters are disposed at a side of the second substrate facing the first substrate, and the plurality of quantum dot color filters correspond to the plurality of light-emitting units in one-to-one correspondence; and
   a plurality of liquid crystal cells disposed between the first substrate and the second substrate and in one-to-one correspondence to the plurality of light-emitting units, wherein each of the plurality of liquid crystal cells comprises cholesteric liquid crystals, and a chiral rotation direction of the cholesteric liquid crystals in one of the plurality of liquid crystal cells is opposite to a chiral rotation direction of the cholesteric liquid crystals in its adjacent ones of the liquid crystal cells.

2. The display panel according to claim 1, wherein the cholesteric liquid crystals are mixed with a photo-isomerizable chiral compound, so that adjacent ones of the plurality of liquid crystal cells have cholesteric liquid crystals with different chiral rotation directions.

3. The display panel according to claim 2, wherein the photo-isomerizable chiral compound comprises an ultraviolet light photo-isomerizable chiral compound, and the ultraviolet light photo-isomerizable chiral compound comprises a chiral diarylethylene or a chiral spirene monomer.

4. The display panel according to claim 1, wherein the plurality of liquid crystal cells are composed of a first cholesteric liquid crystal layer close to the first substrate and a second cholesteric liquid crystal layer close to the second substrate.

5. The display panel according to claim 1, wherein the plurality of liquid crystal cells comprise a first liquid crystal cell corresponding to a blue pixel, a second liquid crystal cell corresponding to a green pixel, and a third liquid crystal cell corresponding to a red pixel; and when a chiral rotation direction of the cholesteric liquid crystals in the second liquid crystal cell is one of left-handed or right-handed, a chiral rotation direction of the cholesteric liquid crystals in the first and third liquid crystal cells adjacent to the second liquid crystal cell is another one of left-handed or right-handed.

6. The display panel according to claim 1, wherein the light-emitting unit is a blue light-emitting unit, and a reflection wavelength of the cholesteric liquid crystals ranges from 380 nm to 780 nm.

7. The display panel according to claim 1, wherein the light-emitting unit is a blue light-emitting unit, and a reflection wavelength of the cholesteric liquid crystals ranges from 400 nm to 550 nm.

8. The display panel according to claim 1, wherein the plurality of quantum dot color filters comprise a first color filter portion, a second color filter portion, and a third color filter portion; the first color filter portion comprises a first color filter block and a first color conversion block, the first color filter block is disposed on a side of the second substrate close to the first substrate, and the first color conversion block is disposed on a side of the first color filter block close to the first substrate; the second color filter portion comprises a second color filter block and a second color conversion block, the second color filter block is disposed on a side of the second substrate close to the first substrate, and the second color conversion block is disposed on a side of the second color filter block close to the first substrate; and the third color filter portion comprises a third color filter block and a light-transmitting block, the third color filter block is disposed on a side of the second substrate close to the first substrate, and the light-transmitting block is disposed on a side of the third color filter block close to the first substrate.

9. The display panel according to claim 1, wherein the display panel further comprises a plurality of black matrices disposed on a side of the second substrate facing the first substrate, and disposed between the plurality of quantum dot color filters.

10. A method of manufacturing a display panel, wherein the method of manufacturing the display panel comprises:
    Step S10, providing a first base, and forming a plurality of light-emitting units on a side of the first base to obtain the first substrate;
    Step S20, providing a second base, and forming a plurality of quantum dot color filters on a side of the second base to obtain a second substrate; and
    Step S30, forming a first cholesteric liquid crystal layer and a second cholesteric liquid crystal layer respectively on surfaces of the first substrate and the second substrate opposite to each other, wherein each of the first cholesteric liquid crystal layer and the second cholesteric liquid crystal layer contains a cholesteric liquid crystal composition, and changing a chiral rotation direction of the cholesteric liquid crystal composition in local areas corresponding to each of the first cholesteric liquid crystal layer and the second cholesteric liquid crystal layer; and
    Step S40, assembling the first substrate and the second substrate to obtain the display device, wherein the cholesteric liquid crystal compositions constitute cholesteric liquid crystals, the cholesteric liquid crystals are provided in the first cholesteric liquid crystal layer and the second cholesteric liquid crystal layer, the first cholesteric liquid crystal layer and the second cholesteric liquid crystal layer collectively constitute a plurality of liquid crystal cells, and the plurality of liquid crystal cells are disposed between the first substrate and the second substrate and in one-to-one correspondence to the plurality of light-emitting units; wherein a chiral rotation direction of the cholesteric liquid crystals in one of the plurality of liquid crystal cells is opposite to a chiral rotation direction of the cholesteric liquid crystals in its adjacent ones of the liquid crystal cells; wherein when blue light emitted by one of the light-emitting units passes through a corresponding one of the liquid crystal cells to obtain a first polarized light, the first polarized light is blocked by another one of the liquid crystal cells adjacent to the corresponding liquid crystal cell; while when the blue light passes through another one of the liquid crystal cells adjacent to the corresponding liquid crystal cell to obtain a second polarized light, the second polarized light is blocked by the corresponding liquid crystal cell.

11. The method of manufacturing a display panel according to claim 10, wherein in the step S30, the cholesteric liquid crystal composition comprises: 60 wt %-98.8 wt % of a nematic liquid crystal, 0.5 wt %-30 wt % of a liquid crystal polymerizable monomer, 0.05 wt %-11 wt % of a photo-isomerizable chiral compound, 0.05 wt %-1.5 wt % of an accelerator; and the step S30 further comprises: Step S301: locally performing a first ultraviolet light irradiation on the cholesteric liquid crystal composition in an area of the liquid crystal cells, so that the photo-isomerizable chiral compound in the cholesteric liquid crystal composition in the irradiated area of the liquid crystal cells undergoes isomerization to change the chiral rotation direction of the cholesteric liquid crystal composition; and Step S302, performing a second ultraviolet light irradiation on the cholesteric liquid crystal composition, so that the liquid crystalline polymerizable monomer undergoes a crosslinking reaction to form the cholesteric liquid crystals with a polymer network.

12. The method of manufacturing a display panel according to claim 10, wherein in step S301, the first ultraviolet light irradiation is locally performed on at least one of the plurality of liquid crystal cells, and the first ultraviolet light irradiation avoids the liquid crystal cells adjacent to the at least one liquid crystal cell.

13. The display panel according to claim 10, wherein the cholesteric liquid crystals are mixed with a photo-isomerizable chiral compound, so that adjacent ones of the plurality of liquid crystal cells have cholesteric liquid crystals with different chiral rotation directions.

14. The display panel according to claim 13, wherein the photo-isomerizable chiral compound comprises an ultraviolet light photo-isomerizable chiral compound, and the ultraviolet light photo-isomerizable chiral compound comprises a chiral diarylethylene or a chiral spirene monomer.

15. The display panel according to claim 10, wherein the plurality of liquid crystal cells are composed of a first cholesteric liquid crystal layer close to the first substrate and a second cholesteric liquid crystal layer close to the second substrate.

16. The display panel according to claim 10, wherein the plurality of liquid crystal cells comprise a first liquid crystal cell corresponding to a blue pixel, a second liquid crystal cell corresponding to a green pixel, and a third liquid crystal cell corresponding to a red pixel; and when a chiral rotation direction of the cholesteric liquid crystals in the second liquid crystal cell is one of left-handed or right-handed, a chiral rotation direction of the cholesteric liquid crystals in the first and third liquid crystal cells adjacent to the second liquid crystal cell is another one of left-handed or right-handed.

17. The display panel according to claim 10, wherein the light-emitting unit is a blue light-emitting unit, and a reflection wavelength of the cholesteric liquid crystals ranges from 380 nm to 780 nm.

18. The display panel according to claim 10, wherein the light-emitting unit is a blue light-emitting unit, and a reflection wavelength of the cholesteric liquid crystals ranges from 400 nm to 550 nm.

19. The display panel according to claim 10, wherein the plurality of quantum dot color filters comprise a first color filter portion, a second color filter portion, and a third color filter portion; the first color filter portion comprises a first color filter block and a first color conversion block, the first color filter block is disposed on a side of the second substrate close to the first substrate, and the first color conversion block is disposed on a side of the first color filter block close to the first substrate; the second color filter portion comprises a second color filter block and a second color conversion block, the second color filter block is disposed on a side of the second substrate close to the first substrate, and the second color conversion block is disposed on a side of the second color filter block close to the first substrate; and the third color filter portion comprises a third color filter block and a light-transmitting block, the third color filter block is disposed on a side of the second substrate close to the first substrate, and the light-transmitting block is disposed on a side of the third color filter block close to the first substrate.

20. The display panel according to claim 10, wherein the display panel further comprises a plurality of black matrices disposed on a side of the second substrate facing the first substrate, and disposed between the plurality of quantum dot color filters.

\* \* \* \* \*